(12) United States Patent
Lu et al.

(10) Patent No.: US 10,170,515 B2
(45) Date of Patent: Jan. 1, 2019

(54) IMPLANTATION PROCESS FOR SEMICONDUCTOR DEVICE

(71) Applicant: TAIWAN SEMICONDUCTOR MANUFACTURING CO., LTD., Hsinchu (TW)

(72) Inventors: Che-Chun Lu, Tainan (TW);
Ching-Hung Kao, Tainan (TW);
Fu-Cheng Chang, Tainan (TW);
Chia-Pin Cheng, Kaohsiung (TW);
Po-Chun Chiu, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/487,573

(22) Filed: Apr. 14, 2017

(65) Prior Publication Data

US 2018/0301496 A1    Oct. 18, 2018

(51) Int. Cl.
*H01L 27/146* (2006.01)

(52) U.S. Cl.
CPC .... *H01L 27/14643* (2013.01); *H01L 27/1461* (2013.01); *H01L 27/14612* (2013.01); *H01L 27/14632* (2013.01); *H01L 27/14636* (2013.01); *H01L 27/14687* (2013.01); *H01L 27/14689* (2013.01)

(58) Field of Classification Search
CPC .......... H01L 27/14643; H01L 27/1461; H01L 27/14614; H01L 27/14636; H01L 27/1463; H01L 27/14689; H01L 27/14601; H01L 21/0415; H01L 21/2253
See application file for complete search history.

(56) References Cited

U.S. PATENT DOCUMENTS

| | | | |
|---|---|---|---|
| 2010/0181635 A1* | 7/2010 | Wang | H01L 27/1463 257/432 |
| 2014/0220746 A1* | 8/2014 | Sze | H01L 29/66325 438/135 |
| 2016/0043120 A1* | 2/2016 | Ahn | H01L 27/1463 257/229 |

* cited by examiner

*Primary Examiner* — Changhyun Yi
(74) *Attorney, Agent, or Firm* — McClure, Qualey & Rodack, LLP

(57) ABSTRACT

A semiconductor device includes a substrate and a device. The substrate has a first surface and a second surface opposite to each other. The substrate includes a first well region, and the first well region includes a first shallow implantation region adjacent to the first surface and a first deep implantation region adjacent to the second surface, in which a dopant concentration of the first deep implantation region at the second surface is substantially equal to 0. The device is disposed on the first surface of the substrate and adjoins the first shallow implantation region.

20 Claims, 8 Drawing Sheets

IMPLANTATION PROCESS FOR SEMICONDUCTOR DEVICE

BACKGROUND

Semiconductor image sensors are operated to sense light. Typically, the semiconductor image sensors include complementary metal-oxide-semiconductor (CMOS) image sensors (CIS) and charge-coupled device (CCD) sensors, which are widely used in various applications such as digital still camera (DSC), mobile phone camera, digital video (DV) and digital video recorder (DVR) applications. These semiconductor image sensors utilize an array of image sensor elements, each image sensor element including a photodiode and other elements, to absorb light and convert the sensed light into digital data or electrical signals.

Front side illuminated (FSI) CMOS image sensors and back side illuminated (BSI) CMOS image sensors are two types of CMOS image sensors. The FSI CMOS image sensors are operable to detect light projected from their front side while the BSI CMOS image sensors are operable to detect light projected from their backside. When light projected into the FSI CMOS image sensors or the BSI CMOS image sensors, photoelectrons are generated and then are sensed by light-sensing devices in pixels of the image sensors. The more the photoelectrons are generated, the more superior quantum efficiency (QE) the image sensor has, thus improving the image quality of the CMOS image sensors.

However, while CMOS image sensor technologies are rapidly developed, CMOS image sensors with higher image quality are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
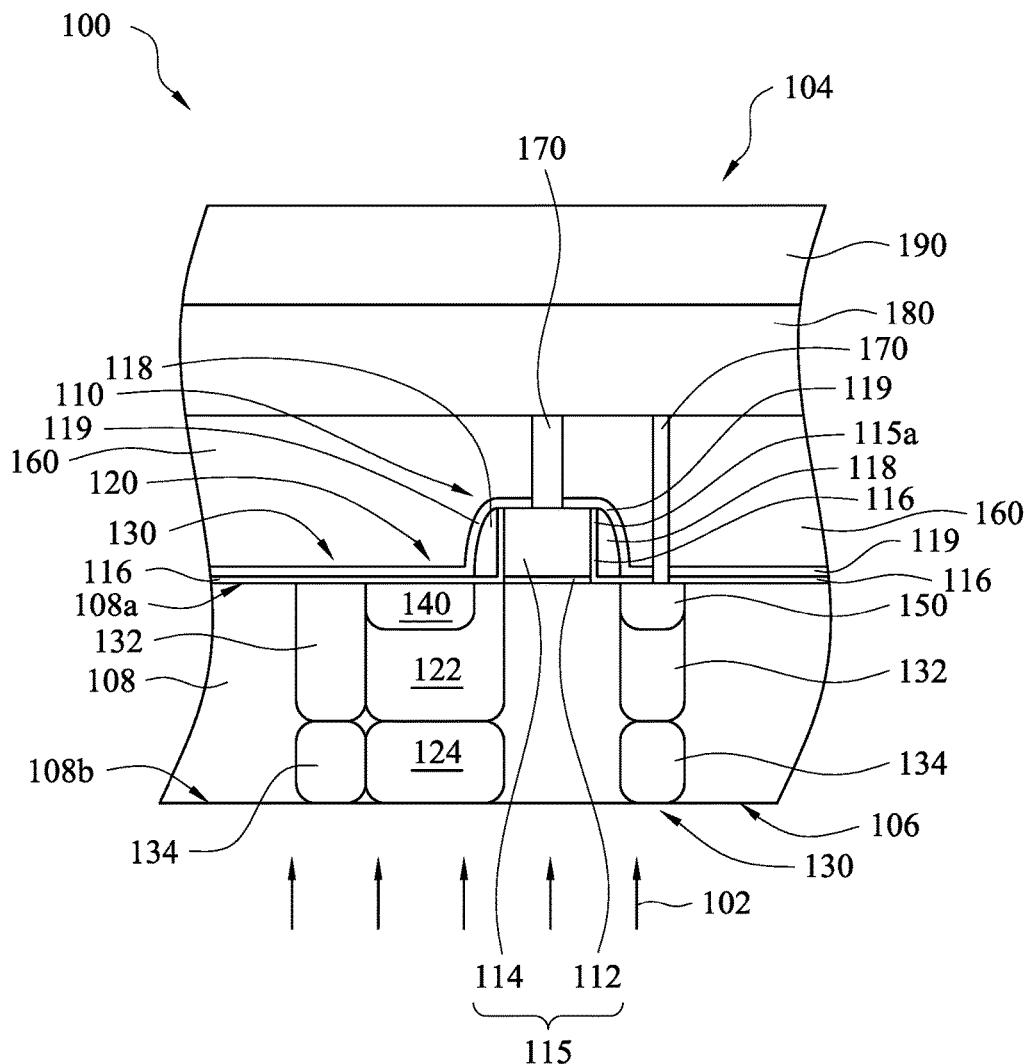
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical process for manufacturing a CMOS image sensor, shallow implantation regions and deep implantation regions of well regions in a substrate are all formed by implanting the substrate from a surface on which devices are formed. However, the implanting of the deep implantation regions requires high implantation energy, such that the substrate is greatly damaged, and thus resulting in current leakage, a dark current phenomenon, and white pixel phenomenon of the CMOS image sensor.

Embodiments of the present disclosure are directed to providing a semiconductor device and a method for manufacturing the semiconductor device, in which shallow implantation regions are formed in a substrate by implanting the substrate from a surface on which device are formed, while deep implantation regions are formed in the substrate by implanting the substrate from a surface opposite to the surface on which devices are formed, such that energy and an amount of dose for implanting the deep implantation regions are significantly reduced, thereby greatly improving current leakage, a dark current phenomenon and a white pixel phenomenon of the semiconductor device, increasing throughput of the semiconductor device, and decreasing cost of the semiconductor device. Furthermore, the energy of implanting the deep implantation regions is significantly reduced, such that a thickness of an implantation mask layer is greatly decreased, and thus simplifying the forming of the implantation mask layer, and facilitating scaling down of the semiconductor device.

FIG. 1 is a schematic cross-sectional view of a semiconductor device in accordance with various embodiments. In some embodiments, a semiconductor device 100 is a CMOS image sensor device, which may be operated for sensing incident light 102. The semiconductor device 100 has a front side 104 and a back side 106. In some examples, the semiconductor device 100 is a BSI CMOS image sensor device, which is operated to sense the incident light 102 projected from its back side 106. As shown in FIG. 1, the semiconductor device 100 mainly includes a substrate 108 and a device 110. The substrate 108 may be composed of a semiconductor material, such as a single-crystalline semiconductor material or a compound semiconductor material. For example, silicon, germanium, or glass may be used as a material of the substrate 108. In some exemplary examples, the substrate 108 may be a silicon substrate.

The substrate 108 has a first surface 108a and a second surface 108b, which are at opposite sides of the substrate 108. The substrate 108 includes a first well region 120. In some examples, the first well region 120 includes a first shallow implantation region 122 and a first deep implantation region 124, in which the first shallow implantation region 122 is adjacent to the first surface 108a of the substrate 108, and the first deep implantation region 124 is adjacent to the second surface 108b. In some exemplary examples, the first shallow implantation region 122 adjoins the first deep implantation region 124. In some examples, the first deep implantation region 124 extends from the first shallow implantation region 122 to the second surface 108b of the substrate 108, and a dopant concentration of the first deep implantation region 124 at the second surface 108b of the substrate 108 is substantially equal to 0. For example, the first shallow implantation region 122 and the first deep implantation region 124 may have the same electrical conductivity type, such as N-type.

In some examples, the semiconductor device 100 further includes a second well region 130. The second well region 130 is formed in the substrate 108 and peripherally surrounds the first well region 120. In some exemplary examples, the second well region 130 includes a second shallow implantation region 132 and a second deep implantation region 134. The second shallow implantation region 132 is adjacent to the first surface 108a of the substrate 108, and the second deep implantation region 134 is adjacent to the second surface 108b. In some exemplary examples, the second shallow implantation region 132 adjoins the first deep implantation region 124. In some examples, the second deep implantation region 134 extends from the second shallow implantation region 132 to the second surface 108b of the substrate 108, and a dopant concentration of the second deep implantation region 134 at the second surface 108b of the substrate 108 is substantially equal to 0. For example, the second shallow implantation region 132 and the second deep implantation region 134 may have the same electrical conductivity type, such as P-type.

The first well region 120 and the second well region 130 have different electrical conductivity types. In some exemplary examples, one of the first well region 120 and the second well region 130 may be an N-type, and the other one of the first well region 120 and the second well region 130 may be a P-type. For example, the first well region 120 is an N-type well, and the second well region 130 is a P-type well. The second well region 130 may be used to block photoelectrons generated by the first well region 120 from escaping to adjacent pixel regions. In some exemplary examples, the first well region 120 is an N-type photodiode well, the first shallow implantation region 122 is an N-type pinned photodiode (NPPD), and the first deep implantation region 124 is a deep N-type pinned photodiode (DNPPD). The second well region 130 is a P-type isolation well, the second shallow implantation region 132 is a shallow P-type well, and the second deep implantation region 134 is a deep P-type well.

In some examples, referring to FIG. 1 again, the semiconductor device 100 may further include a P-type pinned photodiode 140 and an N$^+$-type implantation region 150. The P-type pinned photodiode 140 is disposed in the first shallow implantation region 122 in the substrate 108 and is adjacent to the first surface 108a of the substrate 108. The N$^+$-type implantation region 150 is disposed in the second shallow implantation region 132 in the substrate 108 and is adjacent to the first surface 108a of the substrate 108. For example, the P-type pinned photodiode 140 and the N$^+$-type implantation region 150 adjoin the first surface 108a of the substrate 108.

As shown in FIG. 1, the device 110 is disposed on the first surface 108a of the substrate 108 and adjoins the first shallow implantation region 122. For example, the device 110 may also adjoin the second shallow implantation region 132. In some exemplary examples, the device 110 mainly includes a gate dielectric layer 112, a gate electrode 114, a dielectric layer 116, a spacer 118, and a resist protection oxide (RPO) layer 119. The gate dielectric layer 112 is disposed on the first surface 108a of the substrate 108. The gate dielectric layer 112 may include silicon oxide. The gate electrode 114 is disposed on the gate dielectric layer 112 to form a gate stacked structure 115. The gate electrode 114 is formed from a conductive material, such as polysilicon or metal. The dielectric layer 116 is disposed on a sidewall 115a of the gate stacked structure 115 and the first surface 108a of the substrate 108, in which the dielectric layer 116 peripherally covers the sidewall 115a of the gate stacked structure 115 and extends on the first surface 108a of the substrate 108. The dielectric layer 116 may include silicon oxide. The spacer 118 is disposed on the dielectric layer 116 on the sidewall 115a of the gate stacked structure 115, such that the spacer 118 peripherally surrounds the gate stacked structure 115. A material of the spacer 118 may be different from that of the dielectric layer 116. For example, spacer 118 may include silicon nitride. The resist protection oxide layer 119 covers the spacer 118, the dielectric layer 116, and the gate electrode 114. The resist protection oxide layer 119 may include silicon oxide.

In some examples, referring to FIG. 1, the semiconductor device 100 may further include an interlayer dielectric (ILD) layer 160, various contacts 170, an interconnect layer 180, and a carrier 190. The interlayer dielectric layer 160 is disposed on and covers the resist protection oxide layer 119. For example, the interlayer dielectric layer 160 may include silicon oxide, silicon nitride, silicon oxynitride, the like, or a combination thereof. One of the contacts 170 passes through the interlayer dielectric layer 160 and the resist protection oxide layer 119 to contact the gate electrode 114. The other one of the contacts 170 passes through the interlayer dielectric layer 160, the resist protection oxide layer 119, and the dielectric layer 116 to contact the N$^+$-type implantation region 150. The contacts 170 are formed from conductive materials, such as metal or metal alloy.

The interconnect layer 180 is disposed on and covers the interlayer dielectric layer 160 and the contacts 170. The interconnect layer 180 may include one or more dielectric layers and one or more conductive layers, in which the conductive layers are disposed in the dielectric layers. The conductive layers may be formed from metal or metal alloy. The conductive layers of the interconnect layer 180 contact the contacts 170, such that the conductive layers of the interconnect layer 180 are electrically connected to the contacts 170.

In some examples, the semiconductor device 100 may include a carrier 190. The carrier 190 is bonded to the interconnect layer 180 to support the substrate 108, the device 110, the interlayer dielectric layer 160, the contacts 170, and the interconnect layer 180. The carrier 190 may be composed of a single-crystalline semiconductor material or a compound semiconductor material. For example, the carrier 190 may include silicon, germanium, or glass.

Figure 2A:
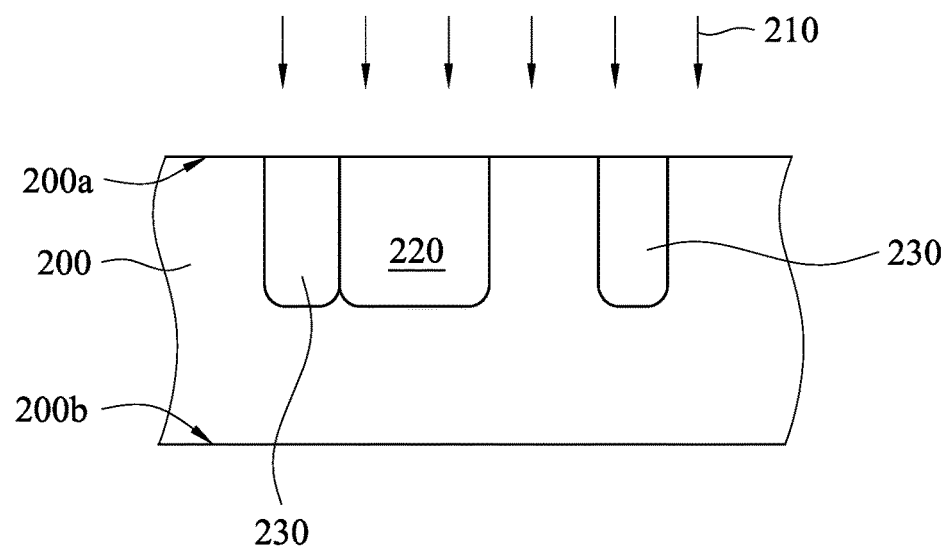
FIG. 2A through FIG. 2H are schematic cross-sectional views of intermediate stages showing a method for manufacturing recesses in a surface of a substrate of a semiconductor device in accordance with various embodiments.

Referring to FIG. 2A through FIG. 2H, FIG. 2A through FIG. 2H are schematic cross-sectional views of intermediate stages showing a method for manufacturing recesses in a surface of a substrate of a semiconductor device in accordance with various embodiments. As shown in FIG. 2A, a substrate 200 is provided. The substrate 200 has a first surface 200a and a second surface 200b which are opposite to each other. For example, the substrate 200 may be composed of a semiconductor material, such as a single-crystalline semiconductor material or a compound semiconductor material. For example, the substrate 200 may include silicon, germanium, or glass.

Referring to FIG. 2A again, a first implantation process 210 is performed on the substrate 200 from the first surface 200a of the substrate 200 to implant dopants into the substrate 200 through the first surface 200a, so as to form a first shallow implantation region 220 in the substrate 200, in which the first shallow implantation region 220 is adjacent to the first surface 200a. In some exemplary examples, the first shallow implantation region 220 extends from the first surface 200a to a certain thickness of the substrate 200. The forming of the first shallow implantation region 220 is performed by firstly masking a portion of the first surface 200a other than a portion of the first surface 200a in which the first shallow implantation region 220 to be formed, and implanting the dopants into the substrate 200 through the first surface 200a. For example, the first shallow implantation region 220 may be an N-type implantation region.

In some examples, as shown in FIG. 2A, performing the first implantation process 210 includes forming a second shallow implantation region 230 in the substrate 200 from the first surface 200a of the substrate 200 to implant dopants into the substrate 200 through the first surface 200a, so as to form a second shallow implantation region 230 in the substrate 200, in which the second shallow implantation region 230 is adjacent to the first surface 200a. In some exemplary examples, the second shallow implantation region 230 extends from the first surface 200a to a certain thickness of the substrate 200. The second shallow implantation region 230 is formed to peripherally surround the first shallow implantation region 220. The forming of the second shallow implantation region 230 is performed by firstly masking a portion of the first surface 200a other than a portion of the first surface 200a in which the second shallow implantation region 230 to be formed, and implanting the dopants into the substrate 200 through the first surface 200a. A conductivity type of the second shallow implantation region 230 is different from that of the first shallow implantation region 220. For example, the second shallow implantation region 230 may be a P-type implantation region.

Figure 2B:
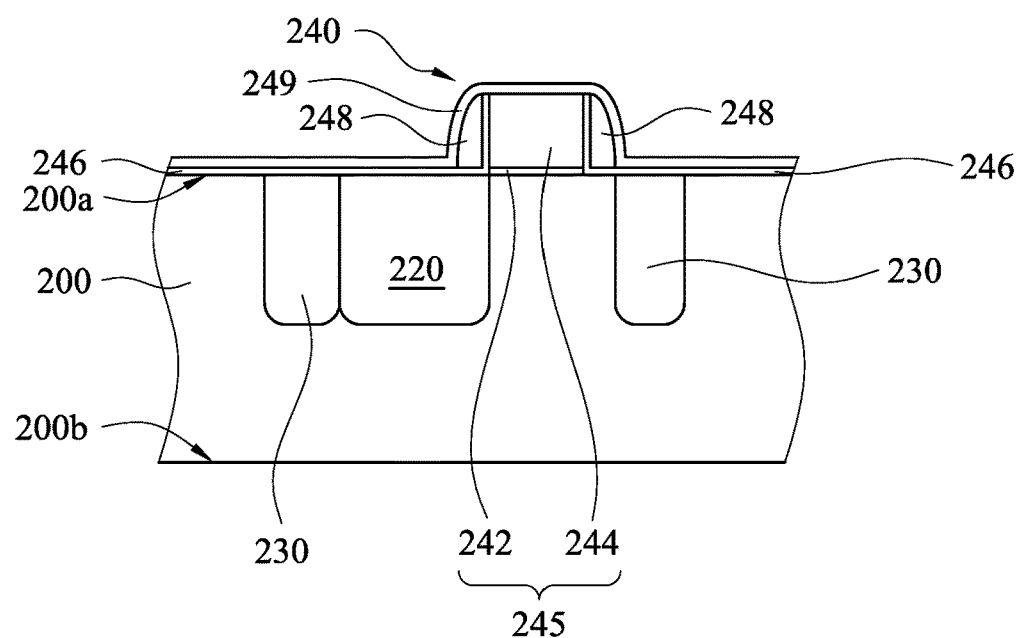

As shown in FIG. 2B, a device 240 is formed on the first surface 200a of the substrate 200. The device 240 is adjacent to the first shallow implantation region 220. For example, the device 240 adjoins and contacts the first shallow implantation region 220. The device 240 may be also adjacent to the second shallow implantation region 230. In some exemplary examples, in the forming of the device 240, a gate dielectric layer 242 is formed on the first surface 200a of the substrate 200. For example, the gate dielectric layer 242 may be formed by using a thermal oxidation process or a deposition process, such as a chemical vapor deposition (CVD) process. The gate dielectric layer 242 may include silicon oxide. A gate electrode 244 is formed on the gate dielectric layer 242 to form a gate stacked structure 245. For example, the gate electrode 244 may be formed by using a chemical vapor deposition process or a physical vapor deposition (PVD) process. The gate electrode 244 is formed to include a conductive material, such as polysilicon or metal.

Then, a dielectric layer 246 is formed on a sidewall 245a of the gate stack 245 and the first surface 200a of the substrate 200. The dielectric layer 246 is formed to peripherally cover the sidewall 245a of the gate stacked structure 245 and to extend on the first surface 200a of the substrate 200. For example, the dielectric layer 246 may be formed by using a deposition process, a photolithography process, and an etch process, in which the deposition process may be a chemical vapor deposition process, and the etch process may be a dry etch process or a wet process. The dielectric layer 246 may be formed to include silicon oxide. A spacer 248 is formed on the dielectric layer 246 on the sidewall 245a of the gate stacked structure 245, such that the spacer 248 is formed to peripherally surround the gate stacked structure 245. For example, the spacer 248 may be formed by using a deposition process and an etch back process, in which the deposition process may be a chemical vapor deposition process or a physical vapor deposition process, and the etch back process may be a dry etch process. In some exemplary examples, the spacer 248 is formed to include a material, which is different from that of the dielectric layer 246. For example, the spacer 248 is formed to include silicon nitride. A resist protection oxide layer 249 is formed to cover the spacer 248, the dielectric layer 246, and the gate electrode 244. For example, the resist protection oxide layer 249 may be formed by using a chemical vapor deposition process. The resist protection oxide layer 249 may be formed to include silicon oxide.

Figure 2C:
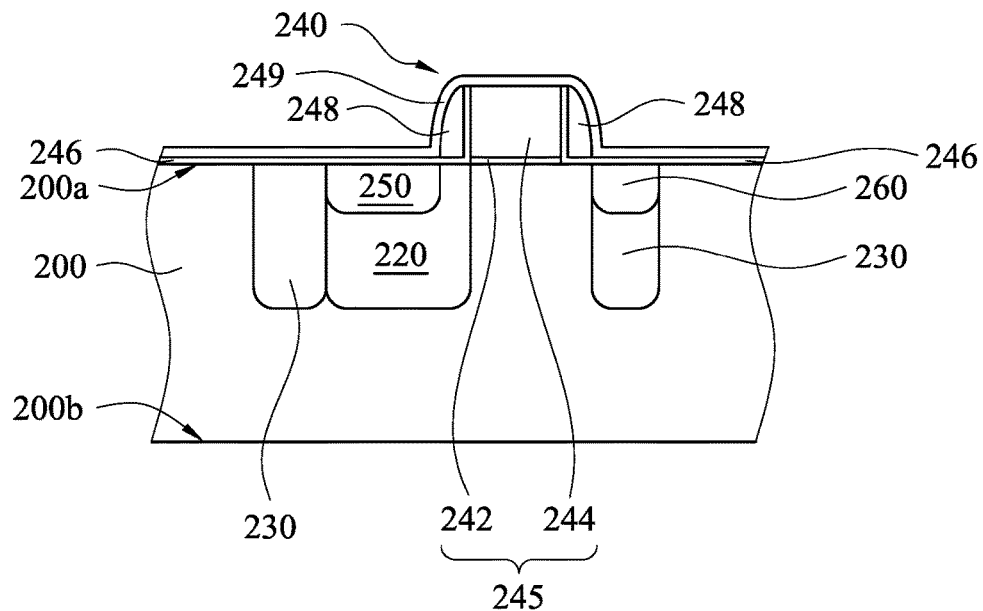

In some examples, the first shallow implantation region 220 is an N-type pinned photodiode, and the second shallow implantation region 230 is a shallow P-type well. As shown in FIG. 2C, after the device 240 is completed and before a thinning process 310 (see FIG. 2F) is performed, a P-type pinned photodiode 250 is formed in the first shallow implantation region 220 in the substrate 200, and an $N^+$-type implantation region 260 is formed in the second shallow implantation region 230 in the substrate 200 by using an implanting technique. In some exemplary examples, the P-type pinned photodiode 250 and the $N^+$-type implantation region 260 are formed by implanting the substrate 200 from the first surfaced 200a of the substrate 200, such that the P-type pinned photodiode 250 and the $N^+$-type implantation region 260 are formed to be adjacent to the first surface 200a of the substrate 200. For example, the P-type pinned photodiode 250 and the $N^+$-type implantation region 260 adjoin the first surface 200a of the substrate 200.

Figure 2D:
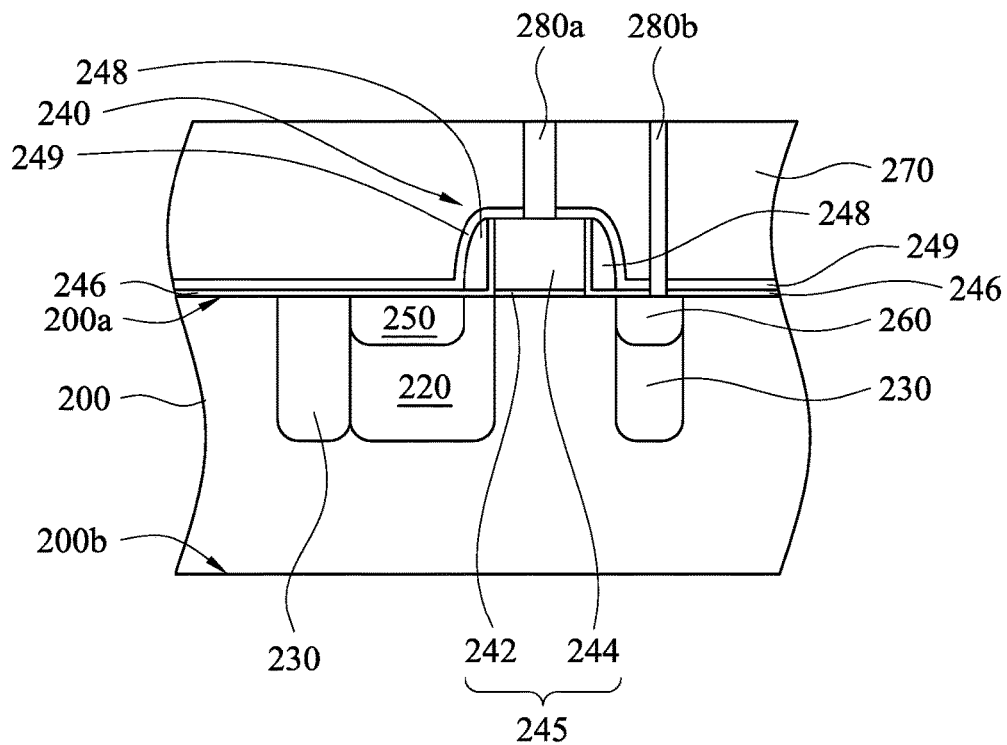

In some examples, as shown in FIG. 2D, after the forming of the P-type pinned photodiode 250 and the $N^+$-type implantation region 260 are completed, an interlayer dielectric layer 270 is formed on the resist protection oxide layer 249 of the device 240 and covering the resist protection oxide layer 249 and the first surface 200a of the substrate 200. For example, the interlayer dielectric layer 270 may be formed by using a chemical vapor deposition process or a physical vapor deposition process. The interlayer dielectric layer 270 may be formed to include silicon oxide, silicon nitride, silicon oxynitride, the like, or a combination thereof.

Referring to FIG. 2D again, after the forming of the interlayer dielectric layer 270 is completed, contacts 280a and 280b are formed in the interlayer dielectric layer 270. The contacts 280a and 280b are formed conductive materials, such as metal or metal alloy. The contact 280a passes through the interlayer dielectric layer 270 and the resist protection oxide layer 249 to contact the gate electrode 244 of the device 240, such that the contact 280a is electrically connected to the gate electrode 244. The contact 280b passes through the interlayer dielectric layer 270, the resist protection oxide layer 249, and the dielectric layer 246 to contact the $N^+$-type implantation region 260, such that the contact 280b is electrically connected to the $N^+$-type implantation region 260. In some exemplary examples, in the forming of the contacts 280a and 280b, portions of the interlayer dielectric layer 270 are removed to form through holes 270a and 270b, which respectively exposes a portion of the gate electrode 244 and a portion of the $N^+$-type implantation region 260, by using a photolithography process and an etch process, and a conductive material is filled in the through holes 270a and 270b to form the contacts 280a and 280b respectively in the through holes 270a and 270b by using a deposition process and a polishing process.

Figure 2E:
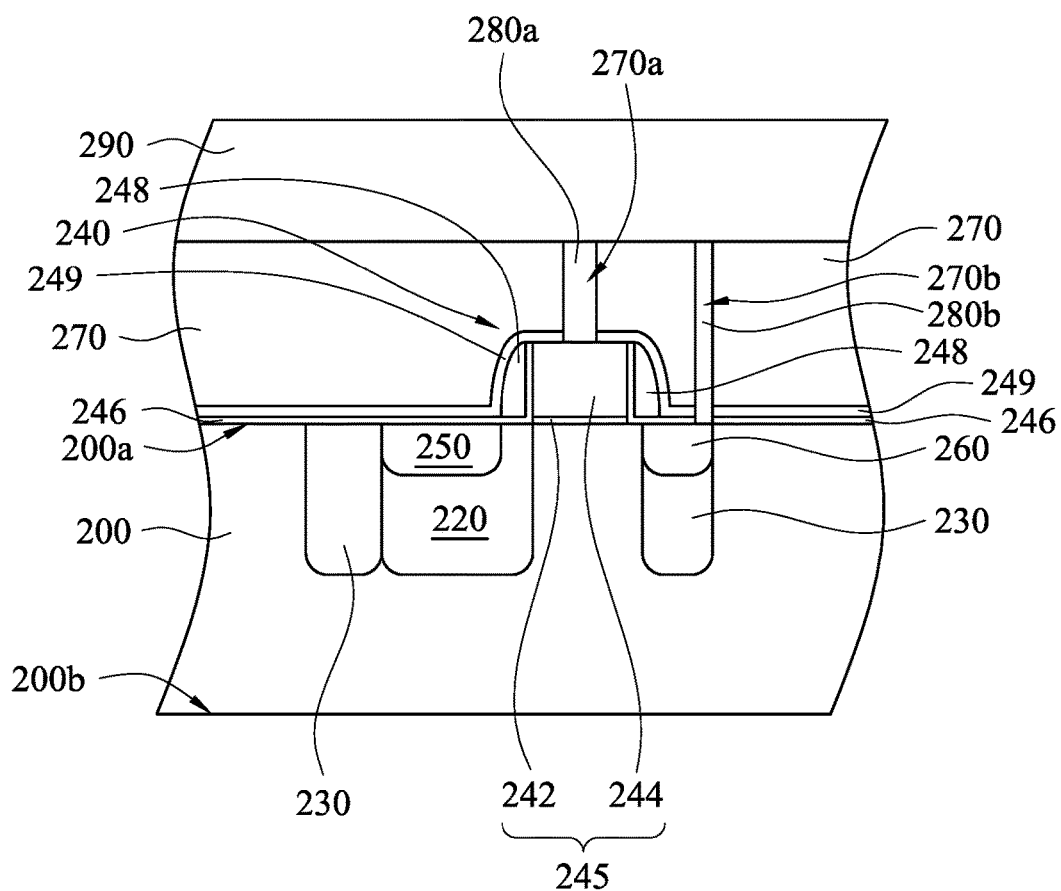

In some examples, as shown in FIG. 2E, an interconnect layer 290 is formed on and covering the interlayer dielectric layer 270 and the contacts 280a and 280b. The interconnect layer 290 may be formed to include one or more dielectric layers and one or more conductive layers, in which the conductive layers are formed in the dielectric layers. The conductive layers may be formed from metal or metal alloy. The conductive layers of the interconnect layer 290 are formed to contact the contacts 280a and 280b, such that the conductive layers of the interconnect layer 290 are electrically connected to the contacts 280a and 280b.

Figure 2F:
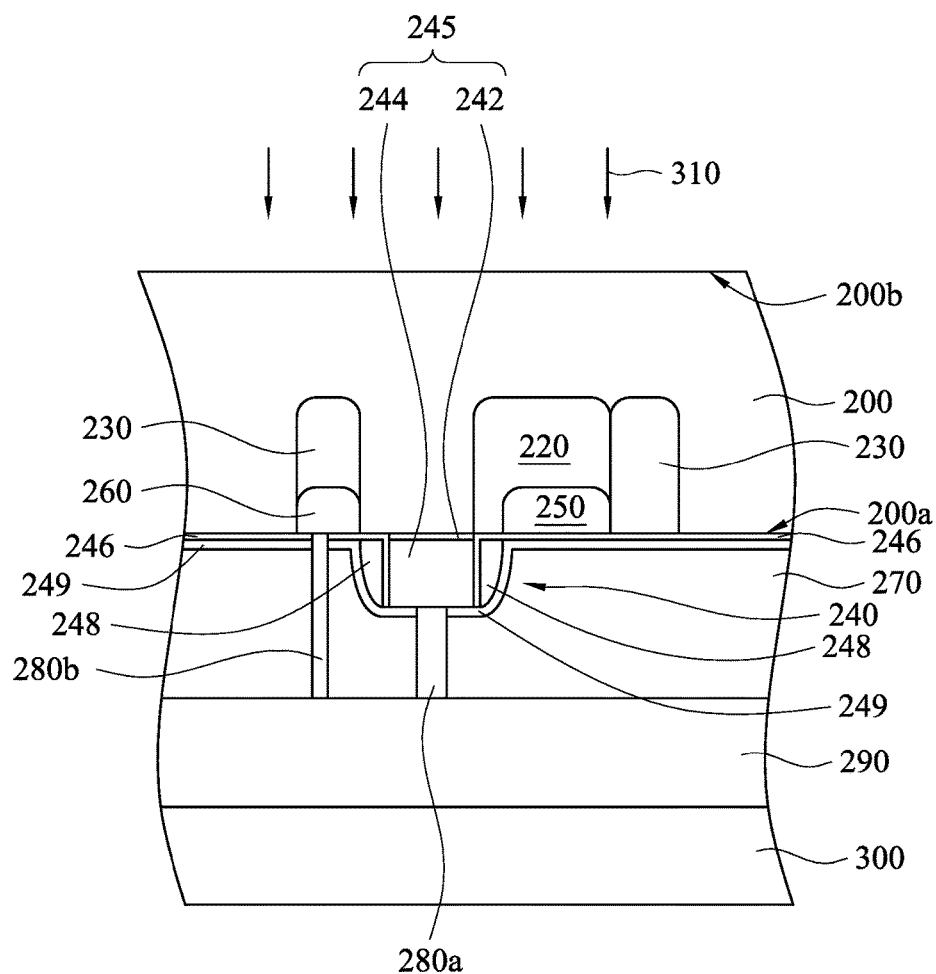

In some examples, as shown in FIG. 2F, after the interconnect layer 290 is completed, a carrier 300 is provided. The carrier 300 may be provided to include a single-crystalline semiconductor material or a compound semiconductor material. For example, the carrier 300 may be provided to include silicon, germanium, or glass. The substrate 200, and the device 240, the interlayer dielectric layer 270, the contacts 280a and 280b, and the interconnect layer 290 formed on the first surface 200a of the substrate 200 are reversed. Then, the interconnect layer 290 disposed on the device 240 is bonded to the carrier 290, such that the first surface 200a of the substrate 200 is opposite to the carrier 300.

Figure 2G:
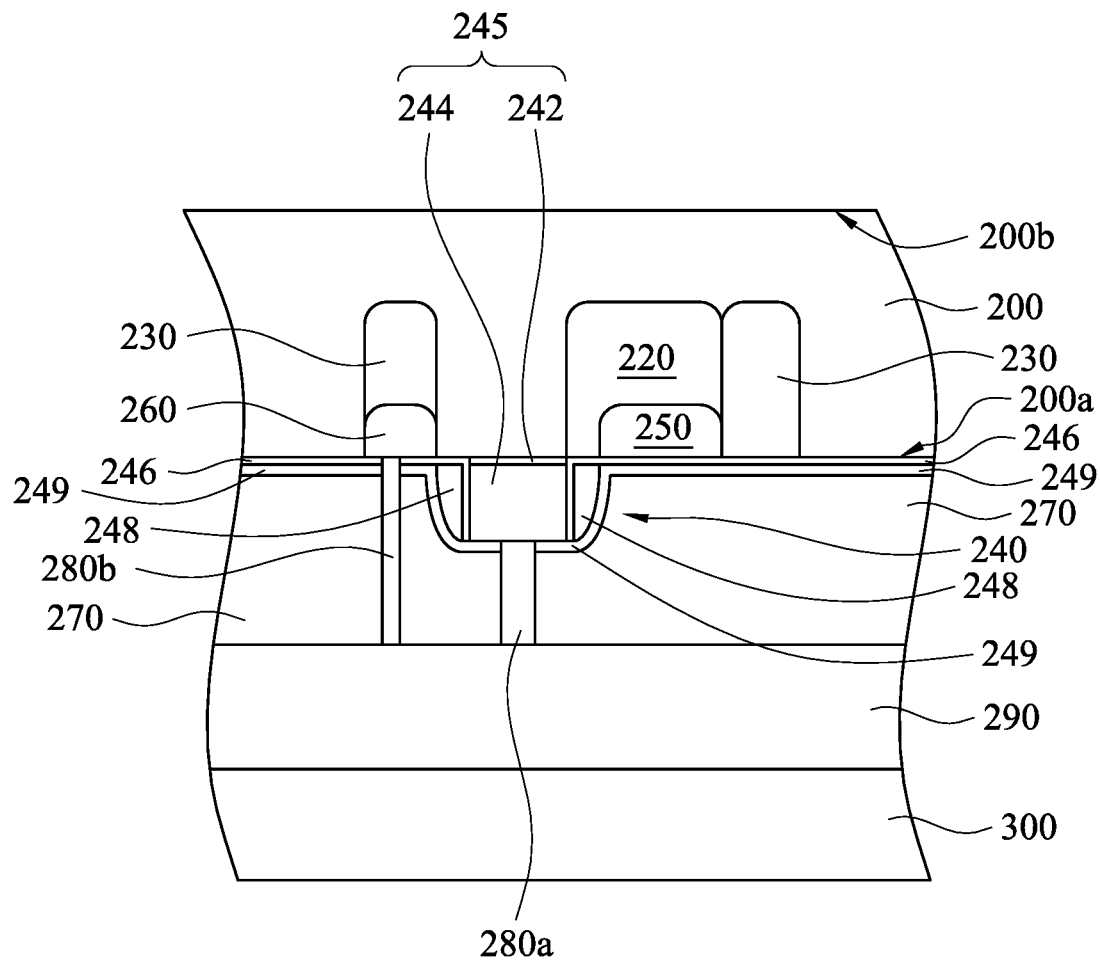

Referring to FIG. 2F again, after the interconnect layer 290 on the device 240 is bonded to the carrier 300, a thinning process 310 is performed on the second surface 200b of the substrate 200 to thin the substrate 200 from the second surface 200b. As shown in FIG. 2G, after the thinning process is completed, a thickness of the substrate 200 is reduced. For example, the thinning process 310 may be performed by using a mechanical polishing technique and/or a chemical polish technique. The thinning process 310 may include various polishing operations. In some exemplary examples, the thinning process 310 includes one or more chemical mechanical polishing operations.

Figure 2H:
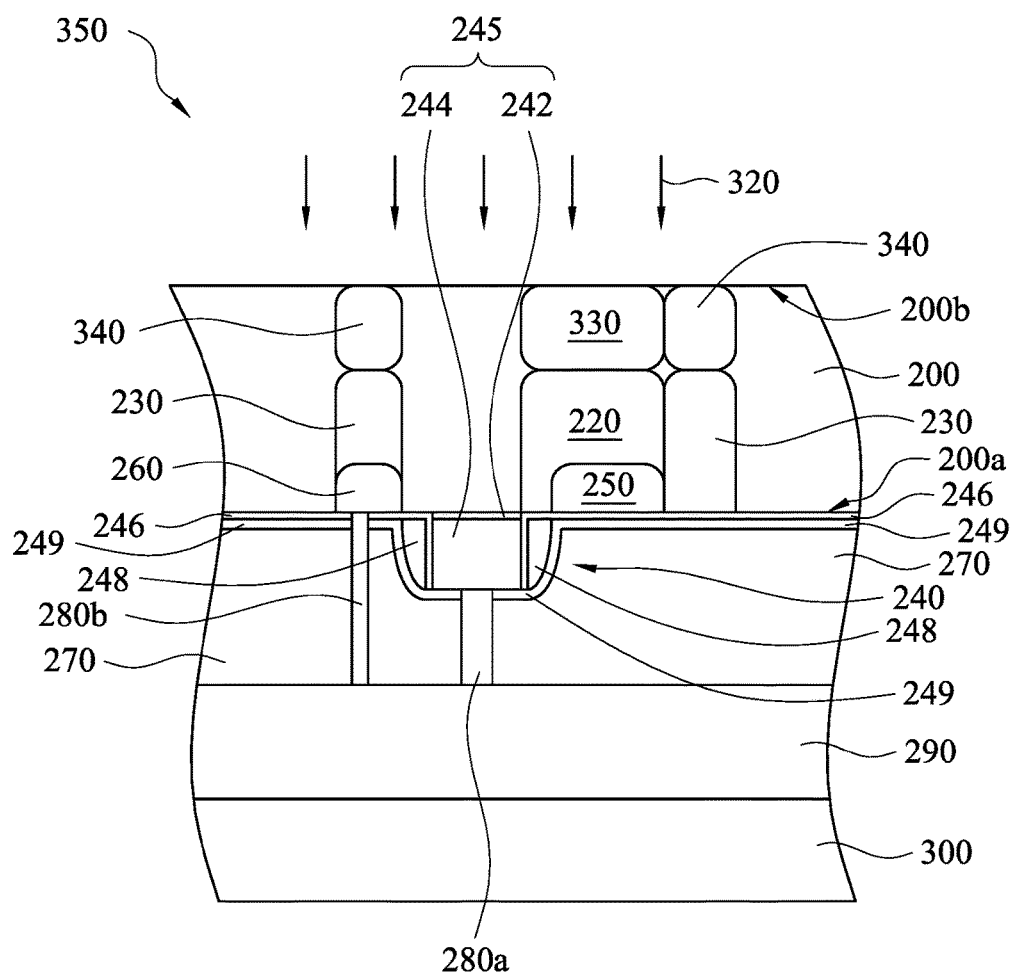

As shown in FIG. 2H, after the thinning process 310 is completed, a second implantation process 320 is performed on the substrate 200 from the second surface 200b to implant dopants into the substrate 200 through the second surface 200b, so as to form a first deep implantation region 330 in the substrate 200, in which the first deep implantation region 330 is adjacent to the second surface 200b. In some exemplary examples, the first deep implantation region 330 extends from the second surface 200b to the first shallow implantation region 220 and adjoins the first shallow implantation region 220. The forming of the first deep implantation region 330 is performed by firstly masking a portion of the second surface 200b other than a portion of the second surface 200b in which the first deep implantation region 330 to be formed, and implanting the dopants into the substrate 200 through the second surface 200b. For example, the first deep implantation region 330 may be an N-type implantation region. A dopant concentration of the first deep implantation region 330 at the second surface 200b of the substrate 200 may be substantially equal to 0.

In some examples, referring to FIG. 2H again, performing the second implantation process 320 includes forming a second deep implantation region 340 in the substrate 200 from the second surface 200b of the substrate 200 to implant dopants into the substrate 200 through the second surface 200b, so as to form a second deep implantation region 340 in the substrate 200 to substantially complete a semiconductor device 350. The second deep implantation region 340 is adjacent to the second surface 200b. In some exemplary examples, the second deep implantation region 340 extends from the second surface 200b to the second shallow implantation region 230 and adjoins the second shallow implantation region 230. The second deep implantation region 340 is formed to peripherally surround the first deep implantation region 330. The forming of the second deep implantation region 340 is performed by firstly masking a portion of the second surface 200b other than a portion of the second surface 200b in which the second deep implantation region 340 to be formed, and implanting the dopants into the substrate 200 through the second surface 200b. A dopant concentration of the second deep implantation region 340 at the second surface 200b of the substrate 200 may be substantially equal to 0.

A conductivity type of the second deep implantation region 340 is different from that of the first deep implantation region 330. For example, the second deep implantation region 340 may be a P-type implantation region. In some exemplary examples, the first deep implantation region 330 is a deep N-type pinned photodiode, and the second deep implantation region 340 is a deep P-type well.

The first deep implantation region 330 and the second deep implantation region 340 are formed in the substrate 200 by implanting the substrate 200 from the second surface 200b, such that energy and an amount of dose for implanting the first deep implantation region 330 and the second deep implantation region 340 are significantly reduced, thereby greatly improving current leakage, a dark current phenomenon and a white pixel phenomenon of the semiconductor device 350. Furthermore, the amount of the dose for forming the first deep implantation region 330 and the second deep implantation region 340 is reduced, such that throughput of the semiconductor device 350 is increased, and cost of the semiconductor device 350 is decreased. Moreover, the energy of forming the first deep implantation region 330 and the second deep implantation region 340 is significantly reduced, such that a thickness of an implantation mask layer is greatly decreased, and thus simplifying the forming of the implantation mask layer, and facilitating scaling down of the semiconductor device 350.

Figure 3:
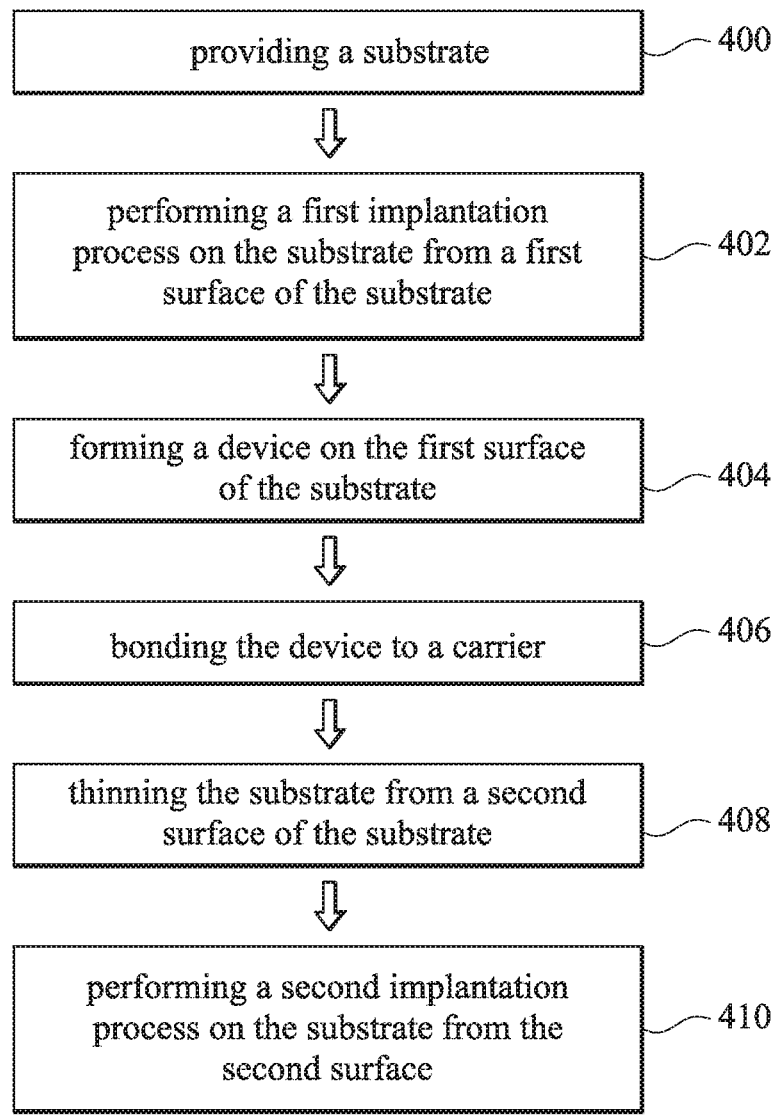
FIG. 3 is a flow chart of a method for manufacturing a semiconductor device in accordance with various embodiments.

Referring to FIG. 3 with FIG. 2A through FIG. 2H, FIG. 3 is a flow chart of a method for manufacturing a semiconductor device in accordance with various embodiments. The method begins at operation 400, where a substrate 200 is provided. As shown in FIG. 2A, the substrate 200 has a first surface 200a and a second surface 200b which is opposite to the first surface 200a.

At operation 402, as shown in FIG. 2A, a first implantation process 210 is performed on the substrate 200 from the first surface 200a of the substrate 200 to implant dopants into the substrate 200 through the first surface 200a, so as to form a first shallow implantation region 220 in the substrate 200 adjacent to the first surface 200a. In some exemplary examples, the first shallow implantation region 220 extends from the first surface 200a to a certain thickness of the substrate 200. For example, in the forming of the first shallow implantation region 220, a portion of the first surface 200a other than a portion of the first surface 200a, in which the first shallow implantation region 220 to be formed, is firstly masked, and the dopants are implanted into the substrate 200 through the first surface 200a. For example, the first shallow implantation region 220 may be an N-type implantation region.

In some examples, referring to FIG. 2A again, the performing of the first implantation process 210 includes forming a second shallow implantation region 230 in the substrate 200 from the first surface 200a of the substrate 200 to implant dopants into the substrate 200 through the first surface 200a, so as to form a second shallow implantation region 230 in the substrate 200 adjacent to the first surface 200a. In some exemplary examples, the second shallow implantation region 230 extends from the first surface 200a to a certain thickness of the substrate 200. The second shallow implantation region 230 is formed to peripherally surround the first shallow implantation region 220. In some exemplary examples, in the forming of the second shallow implantation region 230, a portion of the first surface 200a other than a portion of the first surface 200a, in which the second shallow implantation region 230 to be formed, is masked, and the dopants are implanted into the substrate 200 through the first surface 200a. A conductivity type of the second shallow implantation region 230 is different from that of the first shallow implantation region 220. For example, the second shallow implantation region 230 may be a P-type implantation region.

At operation 404, as shown in FIG. 2B, a device 240 is formed on the first surface 200a of the substrate 200 adjacent to the first shallow implantation region 220. For example, the device 240 may be formed to adjoin and contact the first shallow implantation region 220. The device 240 may be also adjacent to the second shallow implantation region 230. In some exemplary examples, in the forming of the device 240, a gate dielectric layer 242 is formed on the first surface 200a of the substrate 200 by using a thermal oxidation process or a deposition process, such as a chemical vapor deposition process. A gate electrode 244 is formed on the gate dielectric layer 242 to form a gate stacked structure 245. For example, the gate electrode 244 may be formed by using a chemical vapor deposition process or a physical vapor deposition process.

In some exemplary examples, after the gate stacked structure 245 is completed, a dielectric layer 246 is formed on a sidewall 245a of the gate stack 245 and the first surface 200a of the substrate 200 by using a deposition process, a photolithography process, and an etch process, in which the deposition process may be a chemical vapor deposition process, and the etch process may be a dry etch process or a wet process. The dielectric layer 246 is formed to peripherally cover the sidewall 245a of the gate stacked structure 245 and to extend on the first surface 200a of the substrate 200. A spacer 248 is formed on the dielectric layer 246 on the sidewall 245a of the gate stacked structure 245, such that the spacer 248 is formed to peripherally surround the gate stacked structure 245. For example, the spacer 248 may be formed by using a deposition process and an etch back process, in which the deposition process may be a chemical vapor deposition process or a physical vapor deposition process, and the etch back process may be a dry etch process. In some exemplary examples, the spacer 248 is formed to include a material, which is different from that of the dielectric layer 246. For example, the dielectric layer 246 may be formed to include silicon oxide, and the spacer 248 is formed to include silicon nitride. A resist protection oxide layer 249 is formed to cover the spacer 248, the dielectric layer 246, and the gate electrode 244 by using, for example, a chemical vapor deposition process.

In some examples, the first shallow implantation region 220 is an N-type pinned photodiode, and the second shallow implantation region 230 is a shallow P-type well. As shown in FIG. 2C, after the device 240 is completed, a P-type pinned photodiode 250 is formed in the first shallow implantation region 220 in the substrate 200, and an $N^+$-type implantation region 260 is formed in the second shallow implantation region 230 in the substrate 200 by using an implanting technique. In some exemplary examples, the P-type pinned photodiode 250 and the $N^+$-type implantation region 260 are formed by implanting the substrate 200 from the first surfaced 200a of the substrate 200, such that the P-type pinned photodiode 250 and the $N^+$-type implantation region 260 are adjacent to the first surface 200a of the substrate 200. For example, the P-type pinned photodiode 250 and the $N^+$-type implantation region 260 adjoin the first surface 200a of the substrate 200.

In some examples, as shown in FIG. 2D, after the device 240, the P-type pinned photodiode 250, and the $N^+$-type implantation region 260 are completed, an interlayer dielectric layer 270 is formed on the resist protection oxide layer 249 of the device 240 by using, for example, a chemical vapor deposition process or a physical vapor deposition process. The interlayer dielectric layer 270 is formed to cover the resist protection oxide layer 249 and the first surface 200a of the substrate 200.

In some examples, referring to FIG. 2D again, after the interlayer dielectric layer 270 is completed, contacts 280a and 280b are formed in the interlayer dielectric layer 270. The contacts 280a and 280b are formed conductive materials. The contact 280a are formed to pass through the interlayer dielectric layer 270 and the resist protection oxide layer 249 to contact the gate electrode 244 of the device 240, such that the contact 280a is electrically connected to the gate electrode 244. The contact 280b is formed to pass through the interlayer dielectric layer 270, the resist protection oxide layer 249, and the dielectric layer 246 to contact the $N^+$-type implantation region 260, such that the contact 280b is electrically connected to the $N^+$-type implantation region 260. In some exemplary examples, the forming of the contacts 280a and 280b includes removing portions of the interlayer dielectric layer 270 to form through holes 270a and 270b to respectively expose a portion of the gate electrode 244 and a portion of the $N^+$-type implantation region 260 by using a photolithography process and an etch process, and filling a conductive material into the through holes 270a and 270b to form the contacts 280a and 280b respectively in the through holes 270a and 270b by using a deposition process and a polishing process.

In some examples, as shown in FIG. 2E, after the interlayer dielectric layer 270 and the contacts 280a and 280b are completed, an interconnect layer 290 is formed on and covering the interlayer dielectric layer 270 and the contacts 280a and 280b. For example, the interconnect layer 290 may be formed to include one or more dielectric layers and one or more conductive layers, in which the conductive layers are formed in the dielectric layers. The conductive layers of the interconnect layer 290 are formed to contact the contacts 280a and 280b, such that the conductive layers of the interconnect layer 290 are electrically connected to the contacts 280a and 280b.

At operation 406, as shown in FIG. 2F, after the device 240 is formed and the interconnect layer 290 is completed, a carrier 300 is provided. The substrate 200, and the device 240, the interlayer dielectric layer 270, the contacts 280a and 280b, and the interconnect layer 290 formed on the first surface 200a of the substrate 200 are reversed. Then, the interconnect layer 290 disposed on the device 240 is bonded to the carrier 300, such that the device 240 is bonded to the carrier 300, and the first surface 200a of the substrate 200 is opposite to the carrier 300.

At operation 408, referring to FIG. 2F again, a thinning process 310 is performed on the second surface 200b of the substrate 200 to thin the substrate 200 from the second surface 200b by using a mechanical polishing technique and/or a chemical polish technique. The thinning process 310 may include various polishing operations. In some exemplary examples, the thinning process 310 includes one or more chemical mechanical polishing operations. As shown in FIG. 2G, after the thinning process is completed, a thickness of the substrate 200 is reduced.

At operation 410, as shown in FIG. 2H, after the thinning process 310 is completed, a second implantation process 320 is performed on the substrate 200 from the second surface 200b to implant dopants into the substrate 200 through the second surface 200b, so as to form a first deep implantation region 330 in the substrate 200. The first deep implantation region 330 is adjacent to the second surface 200b. In some exemplary examples, the first deep implantation region 330 extends from the second surface 200b to the first shallow implantation region 220 and adjoins the first shallow implantation region 220. In the forming of the first deep implantation region 330, a portion of the second surface 200b other than a portion of the second surface 200b, in which the first deep implantation region 330 to be formed, is masked, and the dopants are implanted into the substrate 200 through the second surface 200b. For example, the first deep implantation region 330 may be an N-type implantation region. A dopant concentration of the first deep implantation region 330 at the second surface 200b of the substrate 200 may be substantially equal to 0.

In some examples, referring to FIG. 2H again, the performing of the second implantation process 320 further includes forming a second deep implantation region 340 in the substrate 200 from the second surface 200b of the substrate 200 to implant dopants into the substrate 200 through the second surface 200b, so as to form a second deep implantation region 340 in the substrate 200 to substantially complete a semiconductor device 350. The second deep implantation region 340 is formed to be adjacent to the second surface 200b and to peripherally surround the first deep implantation region 330. In some exemplary examples, the second deep implantation region 340 extends from the second surface 200b to the second shallow implantation region 230 and adjoins the second shallow implantation region 230. In the forming of the second deep implantation region 340, a portion of the second surface 200b other than a portion of the second surface 200b, in which the second deep implantation region 340 to be formed, is masked, and the dopants are implanted into the substrate 200 through the second surface 200b. A dopant concentration of the second deep implantation region 340 at the second surface 200b of the substrate 200 may be substantially equal to 0.

A conductivity type of the second deep implantation region 340 is different from that of the first deep implantation region 330. For example, the second deep implantation region 340 may be a P-type implantation region. In some exemplary examples, the first deep implantation region 330 is a deep N-type pinned photodiode, and the second deep implantation region 340 is a deep P-type well.

In accordance with an embodiment, the present disclosure discloses a semiconductor device. The semiconductor device includes a substrate and a device. The substrate has a first surface and a second surface opposite to each other. The substrate includes a first well region, and the first well region includes a first shallow implantation region adjacent to the first surface and a first deep implantation region adjacent to the second surface, in which a dopant concentration of the first deep implantation region at the second surface is substantially equal to 0. The device is disposed on the first surface of the substrate and adjoins the first shallow implantation region.

In accordance with another embodiment, the present disclosure discloses a method for manufacturing a semiconductor device. In this method, a substrate is provided, in which the substrate has a first surface and a second surface opposite to each other. A first implantation process is performed on the substrate from the first surface to form a first shallow implantation region in the substrate adjacent to the first surface. A device is formed on the first surface adjacent to the first shallow implantation region. A thinning process is performed on the second surface of the substrate. A second implantation process is performed on the substrate from the second surface to form a first deep implantation region in the substrate adjacent to the second surface, in which the first deep implantation region is formed to adjoin the first shallow implantation region.

In accordance with yet another embodiment, the present disclosure discloses a method for manufacturing a semiconductor device. In this method, a substrate is provided, in which the substrate has a first surface and a second surface opposite to each other. A first implantation process is performed on the substrate from the first surface to form a first shallow implantation region and a second shallow implantation region in the substrate adjacent to the first surface, in which the second shallow implantation region is formed to peripherally surround the first shallow implantation region. A device is formed on the first surface adjacent to the first shallow implantation region and the second shallow implantation region. The device is bonded to a carrier, in which the first surface of the substrate is opposite to the carrier. The substrate is thinned from the second surface. A second implantation process is performed on the substrate from the second surface to form a first deep implantation region and a second deep implantation region in the substrate adjacent to the second surface, in which the first deep implantation region and the second deep implantation region are formed to respectively adjoin to the first shallow implantation region and the second shallow implantation region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
   providing a substrate, wherein the substrate has a first surface and a second surface opposite to each other;
   performing a first implantation process on the substrate from the first surface to form a first shallow implantation region in the substrate adjacent to the first surface;
   forming a device on the first surface adjacent to the first shallow implantation region;
   performing a thinning process on the second surface of the substrate; and performing a second implantation process on the substrate from the second surface to form a first deep implantation region and a second deep implantation region in the substrate adjacent to the second surface, wherein the first deep implantation region is formed to adjoin the first shallow implantation region, the second implantation process is performed such that at least a portion of the second deep implantation region is separated from the first deep implantation region, and the second deep implantation region is formed to peripherally surround the first deep implantation region.

2. The method of claim 1, wherein
performing the first implantation process comprises forming a second shallow implantation region in the substrate adjacent to the first surface, wherein the second shallow implantation region is formed to peripherally surround the first shallow implantation region; and
the second deep implantation region is formed to adjoin the second shallow implantation region.

3. The method of claim 2, wherein the first shallow implantation region is an N-type pinned photodiode, the first deep implantation region is a deep N-type pinned photodiode, the second shallow implantation region is a shallow P-type well, and the second deep implantation region is a deep P-type well.

4. The method of claim 2, wherein after forming the device, the method further comprises:
forming a P-type pinned photodiode in the first shallow implantation region adjacent to the first surface; and
forming an N+-type implantation region in the second shallow implantation region adjacent to the first surface.

5. The method of claim 4, wherein after forming the P-type pinned photodiode and the N+-type implantation region, the method further comprises:
forming an interlayer dielectric layer to cover the device and the substrate;
forming a plurality of contacts in the interlayer dielectric layer to electrically connect to the device and the N+-type implantation region respectively;
forming an interconnect layer to cover the interlayer dielectric layer and to electrically connect to the contacts; and
bonding the interconnect layer to a carrier.

6. The method of claim 2, wherein a dopant concentration of the second deep implantation region at the second surface of the substrate is substantially equal to 0.

7. The method of claim 1, wherein a dopant concentration of the first deep implantation region at the second surface of the substrate is substantially equal to 0.

8. The method of claim 1, further comprising, before performing the thinning process, forming a pinned photodiode in the first shallow implantation region.

9. A method for manufacturing a semiconductor device, the method comprising:
providing a substrate, wherein the substrate has a first surface and a second surface opposite to each other;
performing a first implantation process on the substrate from the first surface to form a first shallow implantation region and a second shallow implantation region in the substrate adjacent to the first surface, wherein the second shallow implantation region is formed to peripherally surround the first shallow implantation region;

forming a device on the first surface adjacent to the first shallow implantation region and the second shallow implantation region;
bonding the device to a carrier, wherein the first surface of the substrate is opposite to the carrier;
thinning the substrate from the second surface; and
performing a second implantation process on the substrate from the second surface to form a first deep implantation region and a second deep implantation region in the substrate adjacent to the second surface, wherein the first deep implantation region and the second deep implantation region are formed to respectively adjoin to the first shallow implantation region and the second shallow implantation region, and the second implantation process is performed such that a conductivity type of the second deep implantation region is different from a conductivity type of the first deep implantation region.

10. The method of claim 9, wherein the first shallow implantation region is an N-type pinned photodiode, the first deep implantation region is a deep N-type pinned photodiode, the second shallow implantation region is a shallow P-type well, and the second deep implantation region is a deep P-type well.

11. The method of claim 10, wherein between forming the device and bonding the device to the carrier, the method further comprises:
forming a P-type pinned photodiode in the first shallow implantation region adjacent to the first surface; and
forming an N+-type implantation region in the second shallow implantation region adjacent to the first surface.

12. The method of claim 11, wherein between forming the P-type pinned photodiode and the N+-type implantation region and bonding the device to the carrier, the method further comprises:
forming an interlayer dielectric layer to cover the device and the substrate;
forming a plurality of contacts in the interlayer dielectric layer to electrically connect to the device and the N+-type implantation region respectively; and
forming an interconnect layer to cover the interlayer dielectric layer and to electrically connect to the contacts.

13. The method of claim 12, wherein forming the device comprises:
forming a gate dielectric layer on the first surface of the substrate;
forming a gate electrode on the gate dielectric layer to form a gate stacked structure;
forming a dielectric layer on a sidewall of the gate stacked structure and the first surface of the substrate;
forming a spacer on the dielectric layer on the sidewall of the gate stacked structure; and
forming a resist protection oxide layer to cover the spacer, the dielectric layer, and the gate electrode.

14. The method of claim 9, wherein
a dopant concentration of the first deep implantation region at the second surface of the substrate is substantially equal to 0; and
a dopant concentration of the second deep implantation region at the second surface of the substrate is substantially equal to 0.

15. A method for manufacturing a semiconductor device, the method comprising:
providing a substrate, wherein the substrate has a first surface and a second surface opposite to each other;

performing a first implantation process on the substrate from the first surface to form a first shallow implantation region in the substrate adjacent to the first surface;

forming a device on the first surface adjacent to the first shallow implantation region;

forming an interlayer dielectric layer to cover the device and the first surface of the substrate;

forming an interconnect layer to cover the interlayer dielectric layer and to electrically connect to the device;

bonding the interconnect layer to a carrier, wherein the first surface of the substrate is opposite to the carrier; and performing a second implantation process on the substrate from the second surface to form a first deep implantation region in the substrate adjacent to the second surface, wherein performing the second implantation process comprises masking a portion of the second surface of the substrate, and the first deep implantation region is formed to adjoin to the first shallow implantation region, wherein the first shallow implantation region is an N-type pinned photodiode and the first deep implantation region is a deep N-type pinned photodiode.

16. The method of claim 15, wherein between forming the device and forming the interlayer dielectric layer, the method further comprises:

forming a P-type pinned photodiode in the first shallow implantation region adjacent to the first surface.

17. The method of claim 15, wherein performing the first implantation process comprises forming a second shallow implantation region in the substrate adjacent to the first surface, wherein the second shallow implantation region is formed to peripherally surround the first shallow implantation region, and the second shallow implantation region is a shallow P-type well; and performing the second implantation process comprises forming a second deep implantation region in the substrate adjacent to the second surface, wherein the second deep implantation region is formed to adjoin the second shallow implantation region and to peripherally surround the first deep implantation region, and the second deep implantation region is a deep P-type well.

18. The method of claim 17, wherein between forming the device and forming the interlayer dielectric layer, the method further comprises:

forming an $N^+$-type implantation region in the second shallow implantation region adjacent to the first surface.

19. The method of claim 17, wherein a dopant concentration of the second deep implantation region at the second surface of the substrate is substantially equal to 0.

20. The method of claim 15, wherein a dopant concentration of the first deep implantation region at the second surface of the substrate is substantially equal to 0.

* * * * *